(12) United States Patent
Tran et al.

(10) Patent No.: US 11,257,553 B2
(45) Date of Patent: *Feb. 22, 2022

(54) FLASH MEMORY CELL AND ASSOCIATED HIGH VOLTAGE ROW DECODER

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/239,397

(22) Filed: Apr. 23, 2021

(65) Prior Publication Data

US 2021/0241839 A1 Aug. 5, 2021

Related U.S. Application Data

(62) Division of application No. 16/879,663, filed on May 20, 2020, now Pat. No. 11,011,240, which is a division of application No. 15/924,100, filed on Mar. 16, 2018, now Pat. No. 10,741,265, which is a
(Continued)

(51) Int. Cl.

| | |
|---|---|
| *G11C 16/00* | (2006.01) |
| *G11C 16/34* | (2006.01) |
| *G11C 16/04* | (2006.01) |
| *G11C 16/10* | (2006.01) |
| *G11C 16/08* | (2006.01) |

(Continued)

(52) U.S. Cl.
CPC ...... *G11C 16/3431* (2013.01); *G11C 16/0425* (2013.01); *G11C 16/08* (2013.01); *G11C 16/10* (2013.01); *G11C 16/16* (2013.01); *G11C 16/28* (2013.01)

(58) Field of Classification Search
CPC ..... G11C 16/3431; G11C 16/28; G11C 16/08; G11C 16/16
See application file for complete search history.

(56) References Cited

U.S. PATENT DOCUMENTS

| | | |
|---|---|---|
| 4,511,881 A | 4/1985 | Adam |
| 6,044,020 A | 3/2000 | Chung et al. |

(Continued)

FOREIGN PATENT DOCUMENTS

| | | |
|---|---|---|
| JP | H02 276095 A | 11/1990 |
| JP | H07 111840 | 11/1995 |

(Continued)

*Primary Examiner* — Mohammed A Bashar
(74) *Attorney, Agent, or Firm* — DLA Piper LLP US

(57) ABSTRACT

The present invention relates to a flash memory cell with only four terminals and a high voltage row decoder for operating an array of such flash memory cells. The invention allows for fewer terminals for each flash memory cell compared to the prior art, which results in a simplification of the decoder circuitry and overall die space required per flash memory cells. The invention also provides for the use of high voltages on one or more of the four terminals to allow for read, erase, and programming operations despite the lower number of terminals compared to prior art flash memory cells.

13 Claims, 24 Drawing Sheets

Memory Cell
300

Related U.S. Application Data division of application No. 15/158,460, filed on May 18, 2016, now Pat. No. 9,953,719.

(51) Int. Cl.
*G11C 16/16* (2006.01)
*G11C 16/28* (2006.01)

(56) References Cited

U.S. PATENT DOCUMENTS

| | | | |
|---|---|---|---|
| 6,282,145 B1 * | 8/2001 | Tran | G11C 11/5621 365/230.06 |
| 9,361,995 B1 | 6/2016 | Tran | |
| 2002/0126550 A1 | 9/2002 | Sugio | |
| 2004/0212008 A1 | 10/2004 | Hasegawa | |
| 2006/0083064 A1 | 4/2006 | Toshiaki | |
| 2007/0025171 A1 | 2/2007 | Kuroda | |
| 2007/0230253 A1 * | 10/2007 | Kim | G11C 16/344 365/185.29 |
| 2008/0315918 A1 | 12/2008 | Luo | |
| 2009/0180317 A1 | 7/2009 | Kang | |
| 2010/0054043 A1 | 3/2010 | Liu | |
| 2010/0128522 A1 | 5/2010 | Choi et al. | |
| 2010/0188900 A1 | 7/2010 | Tran | |
| 2010/0301927 A1 | 12/2010 | Nagai | |
| 2011/0122693 A1 | 5/2011 | Tran et al. | |
| 2012/0268187 A1 | 10/2012 | Kimoto | |
| 2014/0192596 A1 | 7/2014 | Rhie | |
| 2014/0269062 A1 | 9/2014 | Do et al. | |
| 2015/0063027 A1 | 3/2015 | Hashimoto | |
| 2015/0194961 A1 | 7/2015 | Luthra | |

FOREIGN PATENT DOCUMENTS

| | | |
|---|---|---|
| JP | H11 220111 | 8/1999 |
| JP | 2013 200932 | 10/2013 |
| JP | 2014 029745 A | 2/2014 |
| JP | 2014 183233 A | 9/2014 |
| JP | 2015 049916 A | 3/2015 |
| JP | 2015 536011 A | 12/2015 |
| TW | 201618285 A | 5/2016 |
| WO | 2016 053607 | 7/2016 |

* cited by examiner

FLASH MEMORY CELL AND ASSOCIATED HIGH VOLTAGE ROW DECODER

PRIORITY CLAIM

This application is a divisional of U.S. patent application Ser. No. 16/879,663, filed on May 20, 2020, titled, "Flash Memory Cell and Associated High Voltage Row Decoder," and issued as U.S. Pat. No. 11,011,240 on May 18, 2021, which is a divisional of U.S. patent application Ser. No. 15/924,100, filed on Mar. 16, 2018, titled "Flash Memory Cell and Associated Decoders," and issued as U.S. Pat. No. 10,741,265 on Aug. 11, 2020, which is a divisional of U.S. patent application Ser. No. 15/158,460, filed on May 18, 2016, titled, "Flash Memory Cell And Associated Decoders," and issued as U.S. Pat. No. 9,953,719 on Apr. 24, 2018, all of which are incorporated by reference herein.

TECHNICAL FIELD

The present invention relates to a flash memory cell with only four terminals and decoder circuitry for operating an array of such flash memory cells. The invention allows for fewer terminals for each flash memory cell compared to the prior art, which results in a simplification of the decoder circuitry and overall die space required per flash memory cells. The invention also provides for the use of high voltages on one or more of the four terminals to allow for read, erase, and programming operations despite the lower number of terminals compared to prior art flash memory cells.

BACKGROUND OF THE INVENTION

Non-volatile memory cells are well known in the art. One prior art non-volatile split gate memory cell 10, which contains five terminals, is shown in FIG. 1. Memory cell 10 comprises semiconductor substrate 12 of a first conductivity type, such as P type. Substrate 12 has a surface on which there is formed a first region 14 (also known as the source line SL) of a second conductivity type, such as N type. A second region 16 (also known as the drain line) also of N type is formed on the surface of substrate 12. Between the first region 14 and the second region 16 is channel region 18. Bit line BL 20 is connected to the second region 16. Word line WL 22 is positioned above a first portion of the channel region 18 and is insulated therefrom. Word line 22 has little or no overlap with the second region 16. Floating gate FG 24 is over another portion of channel region 18. Floating gate 24 is insulated therefrom, and is adjacent to word line 22. Floating gate 24 is also adjacent to the first region 14. Floating gate 24 may overlap the first region 14 to provide coupling from the first region 14 into floating gate 24. Coupling gate CG (also known as control gate) 26 is over floating gate 24 and is insulated therefrom. Erase gate EG 28 is over the first region 14 and is adjacent to floating gate 24 and coupling gate 26 and is insulated therefrom. The top corner of floating gate 24 may point toward the inside corner of the T-shaped erase gate 28 to enhance erase efficiency. Erase gate 28 is also insulated from the first region 14. Memory cell 10 is more particularly described in U.S. Pat. No. 7,868,375, whose disclosure is incorporated herein by reference in its entirety.

One exemplary operation for erase and program of prior art non-volatile memory cell 10 is as follows. Memory cell 10 is erased, through a Fowler-Nordheim tunneling mechanism, by applying a high voltage on erase gate 28 with other terminals equal to zero volt. Electrons tunnel from floating gate 24 into erase gate 28 causing floating gate 24 to be positively charged, turning on the cell 10 in a read condition. The resulting cell erased state is known as '1' state.

Memory cell 10 is programmed, through a source side hot electron programming mechanism, by applying a high voltage on coupling gate 26, a high voltage on source line 14, a medium voltage on erase gate 28, and a programming current on bit line 20. A portion of electrons flowing across the gap between word line 22 and floating gate 24 acquire enough energy to inject into floating gate 24 causing the floating gate 24 to be negatively charged, turning off the cell 10 in a read condition. The resulting cell programmed state is known as '0' state.

Memory cell 10 is read in a Current Sensing Mode as following: A bias voltage is applied on bit line 20, a bias voltage is applied on word line 22, a bias voltage is applied on coupling gate 26, a bias or zero voltage is applied on erase gate 28, and a ground is applied on source line 14. There exists a cell current flowing from bit line 20 to source line 14 for an erased state and there is insignificant or zero cell current flow from the bit line 20 to the source line 14 for a programmed state. Alternatively, memory cell 10 can be read in a Reverse Current Sensing Mode, in which bit line 20 is grounded and a bias voltage is applied on source line 24. In this mode the current reverses the direction from source line 14 to bitline 20.

Memory cell 10 alternatively can be read in a Voltage Sensing Mode as following: A bias current (to ground) is applied on bit line 20, a bias voltage is applied on word line 22, a bias voltage is applied on coupling gate 26, a bias voltage is applied on erase gate 28, and a bias voltage is applied on source line 14. There exists a cell output voltage (significantly >0V) on bit line 20 for an erased state and there is insignificant or close to zero output voltage on bit line 20 for a programmed state. Alternatively, memory cell 10 can be read in a Reverse Voltage Sensing Mode, in which bit line 20 is biased at a bias voltage and a bias current (to ground) is applied on source line 14. In this mode, memory cell 10 output voltage is on the source line 14 instead of on the bit line 20.

In the prior art, various combinations of positive or zero voltages were applied to word line 22, coupling gate 26, and floating gate 24 to perform read, program, and erase operations In response to the read, erase or program command, the logic circuit 270 (in FIG. 2) causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

TABLE NO. 1

PEO (Positive Erase Operation) Table

| | WL | WL-unsel | BL | BL-unsel | CG | CG-unsel same sector | CG-unsel | EG | EG-unsel | SL | Sl-unsel |
|---|---|---|---|---|---|---|---|---|---|---|---|
| Read | 1.0-2 V | 0 V | 0.6-2 V | 0 V-FLT | 0-2.6 V | 0-2.6 V | 0-2.6 V | 0-2.6 V | 0-2.6 V | 0 V | 0 V-FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | 0 V | 1 uA | Vinh | 10-11 V | 0-2.6 V | 0-2.6 V | 4.5-5 V | 0-2.6 V | 4.5-5 V | 0-1 V/FLT |

In a recent application by the applicant—U.S. patent application Ser. No. 14/602,262, filed on Jan. 21, 2015, which is incorporated by reference—the applicant disclosed an invention whereby negative voltages could be applied to word line 22 and/or coupling gate 26 during read, program, and/or erase operations. In this embodiment, the voltage and current applied to the selected and unselected memory cell 10, are as follows.

TABLE NO. 2

PEO (Positive Erase Operation) Table

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | -0.5 V/0 V | 0.6-2 V | 0 V-FLT | 0-2.6 V | 0-2.6 V | 0-2.6 V | 0-2.6 V | 0-2.6 V | 0 V | 0 V-FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | -0.5 V/0 V | 1 uA | Vinh | 10-11 V | 0-2.6 V | 0-2.6 V | 4.5-5 V | 0-2.6 V | 4.5-5 V | 0-1 V/FLT |

In another embodiment of U.S. patent application Ser. No. 14/602,262, negative voltages can be applied to word line 22 when memory cell 10 is unselected during read, erase, and program operations, and negative voltages can be applied to coupling gate 26 during an erase operation, such that the following voltages are applied:

TABLE NO. 3

PNEO (Positive Negative Erase Operation) Table

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | -0.5 V/0 V | 0.6-2 V | 0-FLT | 0-2.6 V | 0-2.6 V | 0-2.6 V | 0-2.6 V | 0-2.6 V | 0 V | 0-FLT |
| Erase | 0 V | -0.5 V/0 V | 0 V | 0-FLT | -(5-9) V | 0-2.6 V | 0-2.6 V | 8-9 V | 0-2.6 V | 0 V | 0 V |
| Program | 1 V | -0.5 V/0 V | 1 uA | Vinh | 8-9 V | CGINH (4-6 V) | 0-2.6 V | 8-9 V | 0-2.6 V | 4.5-5 V | 0-1 V/FLT |

The CGINH signal listed above is an inhibit signal that is applied to the coupling gate 26 of an unselected cell that shares an erase gate 28 with a selected cell.

FIG. 2 depicts an embodiment recently developed by applicant of an architecture for a flash memory system comprising die 200. Die 200 comprises: memory array 215 and memory array 220 for storing data, memory arrays 215 and 220 comprising rows and columns of memory cells of the type described previously as memory cell 10 in FIG. 1, pad 240 and pad 280 for enabling electrical communication between the other components of die 200 and, typically, wire bonds (not shown) that in turn connect to pins (not shown) or package bumps that are used to access the integrated circuit from outside of the packaged chip or macro interface pins (not shown) for interconnecting to other macros on a SOC (system on chip); high voltage circuit 275 used to provide positive and negative voltage supplies for the system; control logic 270 for providing various control functions, such as redundancy and built-in self-testing; analog circuit 265; sensing circuits 260 and 261 used to read data from memory array 215 and memory array 220, respectively; row decoder circuit 245 and row decoder circuit 246 used to access the row in memory array 215 and memory array 220, respectively, to be read from or written to; column decoder circuit 255 and column decoder circuit 256 used to access bytes in memory array 215 and memory array 220, respectively, to be read from or written to; charge pump circuit 250 and charge pump circuit 251, used to provide increased voltages for program and erase operations for memory array 215 and memory array 220, respectively; negative voltage driver circuit 230 shared by memory array 215 and memory array 220 for read and write operations; high voltage driver circuit 225 used by memory array 215 during read and write operations and high voltage driver circuit 226 used by memory array 220 during read and write operations.

With flash memory systems becoming ubiquitous in all manner of computing and electronic devices, it is increasingly important to create designs that reduce the amount of die space required per memory cell and to reduce the overall complexity of decoders use in flash memory systems. What is needed is flash memory cell design that utilizes fewer terminals than in the prior art and simplified circuitry for operating flash memory cells that follow that design.

SUMMARY OF THE INVENTION

The present invention relates to a flash memory cell with only four terminals and decoder circuitry for operating an array of such flash memory cells. The invention allows for fewer terminals for each flash memory cell compared to the prior art, which results in a simplification of the decoder circuitry and overall die space required per flash memory cells. The invention also provides for the use of high voltages on one or more of the four terminals to allow for read, erase, and programming operations despite the lower number of terminals compared to prior art flash memory cells.

DETAILED DESCRIPTION OF THE PREFERRED EMBODIMENT

Figure 3:
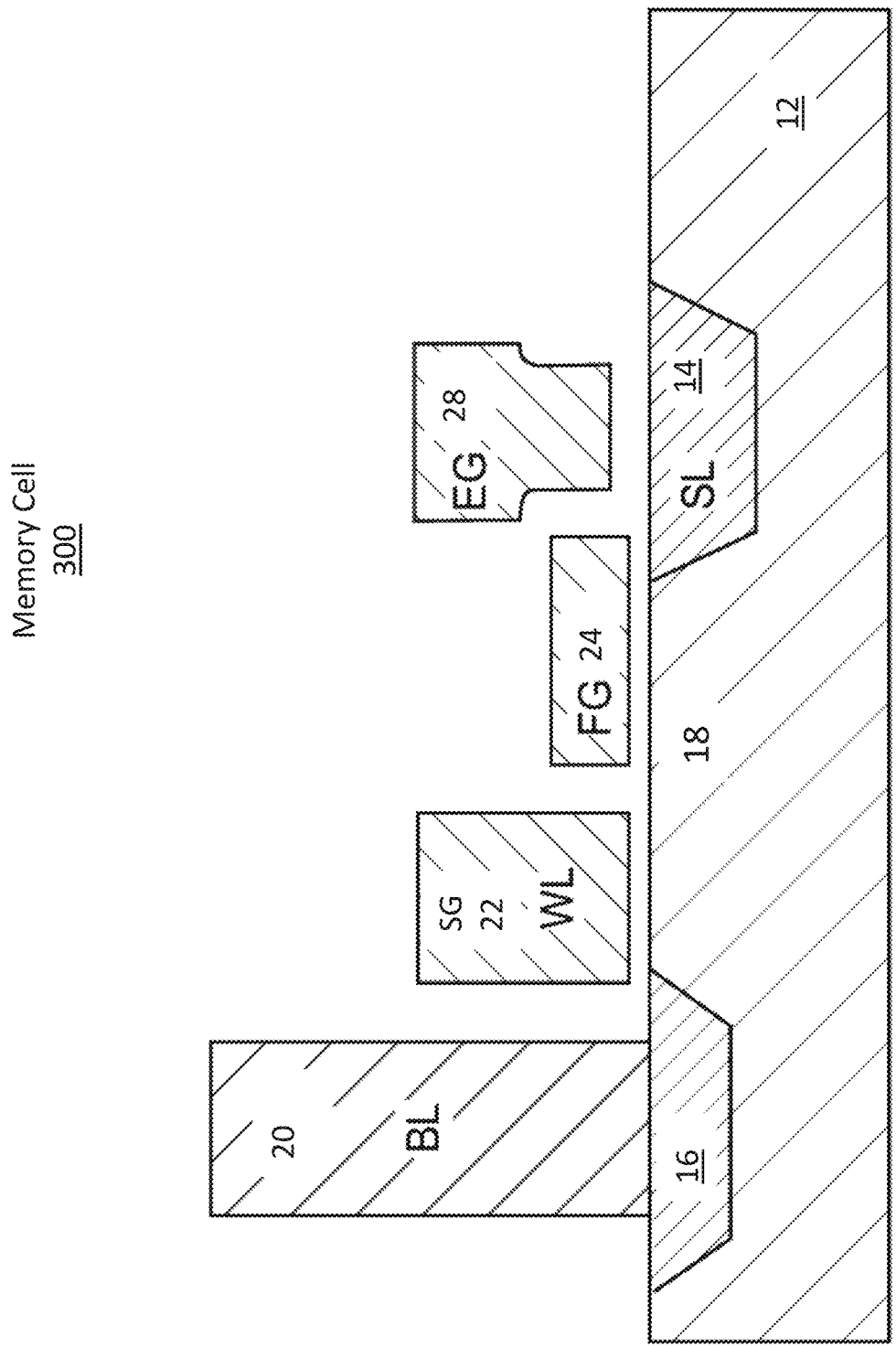
FIG. 3 is a block diagram of an embodiment of a non-volatile memory cell.

FIG. 3 depicts an embodiment of an improved flash memory cell 300. As with prior art flash memory cell 10, flash memory cell 300 comprises substrate 12, first region (source line) 14, second region 16, channel region 18, bit line 20, word line 22, floating gate 24, and erase gate 28. Unlike prior art flash memory cell 10, flash memory cell 300 does not contain a coupling gate or control gate and only contains four terminals—bit line 20, word line 22, erase gate 28, and source line 14. This significantly reduces the complexity of the circuitry, such as decoder circuitry, required to operate an array of flash memory cells.

Figure 1:
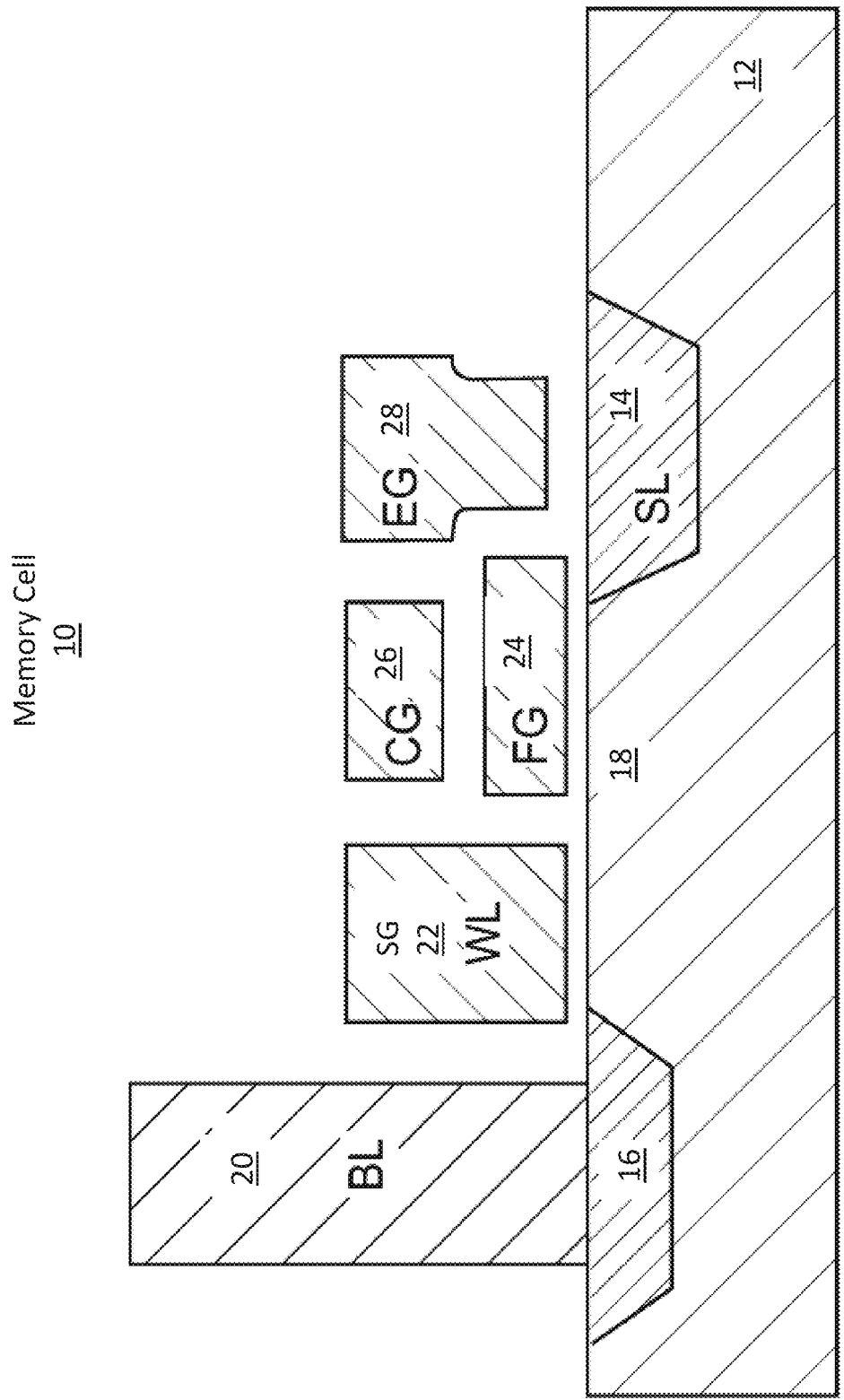
FIG. 1 is a cross-sectional view of a non-volatile memory cell of the prior art to which the method of the present invention can be applied.

The erase operation (erasing through erase gate) and read operation are similar to that of the FIG. 1 except there is no control gate bias. The programming operation also is done without the control gate bias, hence the program voltage on the source line is higher to compensate for lack of control gate bias.

Table No. 4 depicts typical voltage ranges that can be applied to the four terminals for performing read, erase, and program operations:

TABLE NO. 4

| | | | | | | | | |
|---|---|---|---|---|---|---|---|---|
| | | | | Four Terminal Flash Device Operation Table | | | | |
| | WL | WL-unsel | BL | BL-unsel | EG | EG-unsel | SL | SL-unsel |
| Read | 0.7-2.2 V | -0.5 V/0 V | 0.6-2 V | 0 V/FLT | 0-2.6 V | 0-2.6 V | 0 V | 0 V/FLT/ VB |
| Erase | -0.5 V/0 V | -.5 V/0 V | 0 V | 0 V | 11.5 V | 0-2.6 V | 0 V | 0 V |
| Program | 1-1.5 V | -.5 V/0 V | 1-3 µA | Vinh (~1.8 V) | 4.5 V | 0-2.6 V | 7-9 V | 0-1 V/FLT |

Figure 4:
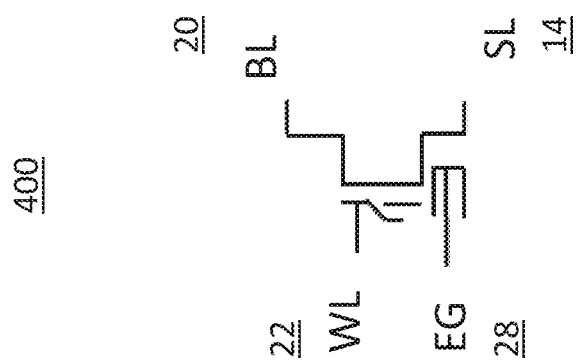
FIG. 4 is a schematic representation of the non-volatile memory cell of FIG. 3.

FIG. 4 depicts a symbolic representation 400 of flash memory cell 300. Symbolic representation 400 comprises symbols for the four terminals of flash memory cell 300, namely, bit line 20, word line 22, erase gate 28, and source line 14.

Figure 5:
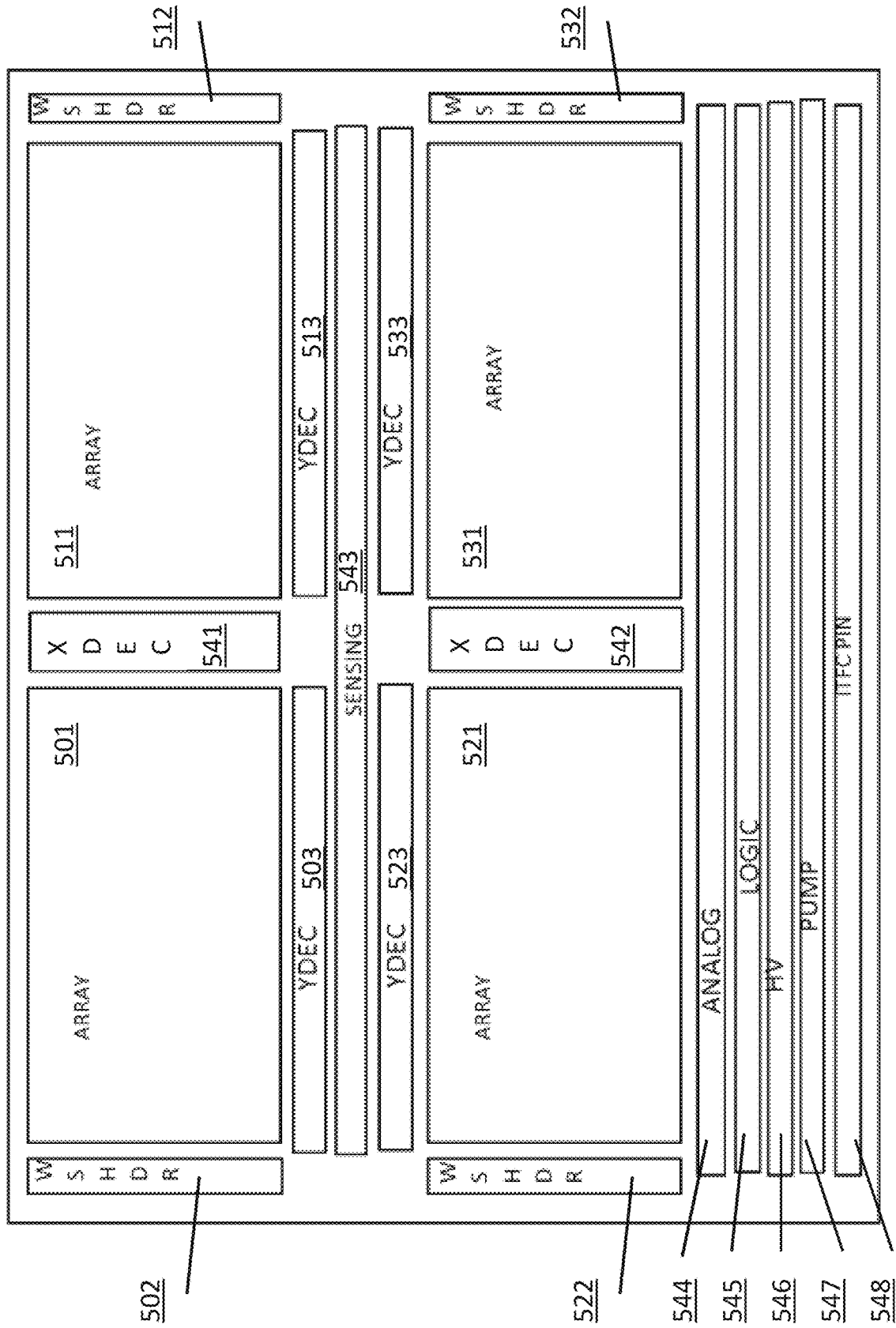
FIG. 5 is a block diagram of a non-volatile memory device using the non-volatile memory cell of FIG. 3.

FIG. 5 depicts an embodiment of an architecture for a flash memory system comprising die 500. Die 500 comprises memory arrays 501, 511, 521, and 531, for storing data, each of memory arrays 501, 511, 521, and 531 comprising rows and columns of memory cells of the type described previously as flash memory cell 300 in FIG. 3. Die 500 further comprises sensing circuit 543 used to read data from memory arrays 501, 511, 521, and 531; row decoder circuit 541 used to access the selected row in memory arrays 501 and 511 and row decoder circuit 542 used to access the selected row in memory arrays 521 and to be read from or written to; column decoder circuits 503, 513, 523, and 533 used to access bytes in memory arrays 501, 511, 521, and 531, respectively, to be read from or written to; high voltage row decoder WSHDR 502, 512, 522, and 532 used to provide high voltage to one or more terminals of the selected memory cell within memory arrays 501, 511, 521, and 531, respectively, depending on the operation being performed.

Die 500 further comprises the following functional structures and sub-systems: macro interface pins ITFC pin 548 for interconnecting to other macros on a SOC (system on chip); low voltage generation (including a low voltage charge pump circuit) circuits 547 and high voltage generation (including a high voltage charge pump circuit) circuit 546 used to provide increased voltages for program and erase operations for memory arrays 501, 511, 521, and 531; analog circuit 544 used by analog circuitry on die 500; digital logic circuit 545 used by digital circuitry on die 500.

Figure 6:
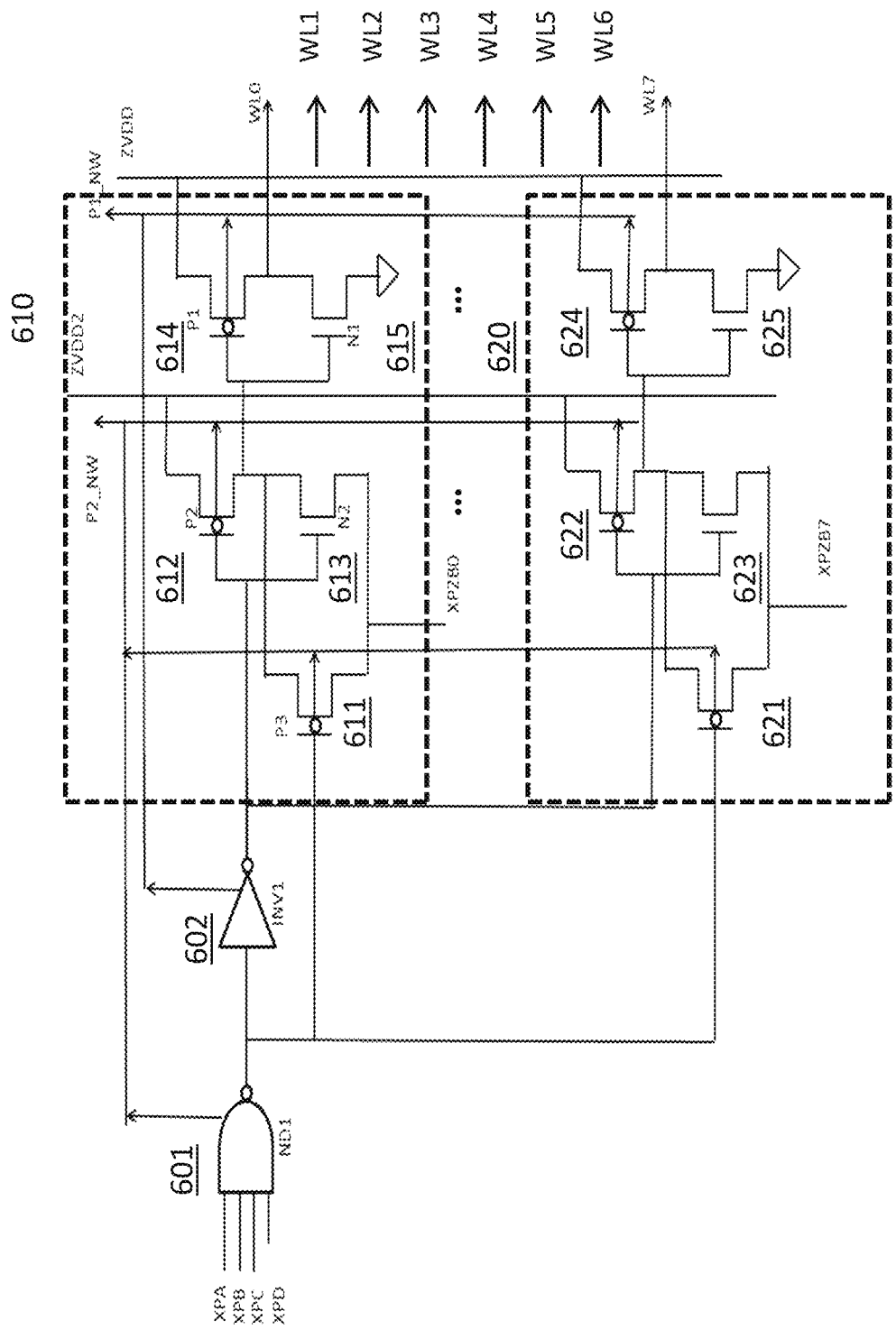
FIG. 6 depicts an embodiment of a row decoder for use with the memory device of FIG. 5.

FIG. 6 depicts row decoder 600 for 8 word lines in a sector within a memory array (such as memory array 501, 511, 521, and 531). Row decoder 600 can be part of row decoder circuits 541 and 542 in die 500. Row decoder 600 comprises NAND gate 601, which receives pre-decoded address signals, here shown as lines XPA, XPB, XPC, and XPD, which select a sector within a memory array. When XPA, XPB XPC, and XPD are all "high," then the output of NAND gate 601 will be "low" and this particular sector will be selected.

Row decoder 600 further comprises inverter 602, decoder circuit 610 to generate word line WL0, decoder circuit 620 to generate WL7, as well as additional decoder circuits (not shown) to generate word lines WL1, WL2, WL3, WL4, WL5, and WL6.

Decoder circuit 610 comprises PMOS transistors 611, 612, and 614 and NMOS transistors 613 and 615, configured as shown. Decoder circuit 610 receives the output of NAND gate 601, the output of inverter 602, and pre-decoded address signal XPZB0. When this particular sector is selected and XPZB0 is "low," then WL0 will be asserted. When XPZB0 is "high," then WL0 will not be asserted.

Similarly, decoder circuit 620 comprises PMOS transistors 621, 622, and 624 and NMOS transistors 623 and 625, configured as shown. Decoder circuit 620 receives the output of NAND gate 601, the output of inverter 602, and pre-decoded address signal XPZ70. When this particular sector is selected and XPZB7 is "low," then WL7 will be asserted. When XPZB7 is "high," then WL7 will not be asserted.

It is to understood that the decoder circuits (now shown) for WL1, WL2, and WL3, WL4, WL5, and WL6 will follow the same design as decoder circuits 610 and 620 except that they will receive the inputs XPZB1, XPZB2, XPZB3, XPZB4, XPZB5, and XPZB6, respectively, instead of XPZB0 or XPZB7.

In the situation where this sector is selected and it is desired for WL0 to be asserted, the output of NAND gate 601 will be "low," and the output of inverter will be "high." PMOS transistor 611 will be turned on, and the node between PMOS transistor 612 and NMOS transistor 613 will receive the value of XPZB0, which will be "low" when word line WL0 is to be asserted. This will turn on PMOS transistor 614, which will pull WL0 "high" to ZVDD which indicates an asserted state. In this instance, XPZB7 is "high," signifying that WL7 is to be not asserted, which will pull the node between PMOS transistor 622 and NMOS transistor 623 to the value of XPZB7 (which is "high"), which will turn on NMOS transistor 624 and cause WL to be "low," which indicates a non-asserted state. In this manner, one of the word lines WL0 . . . WL7 can be selected when this sector is selected.

Figure 7:
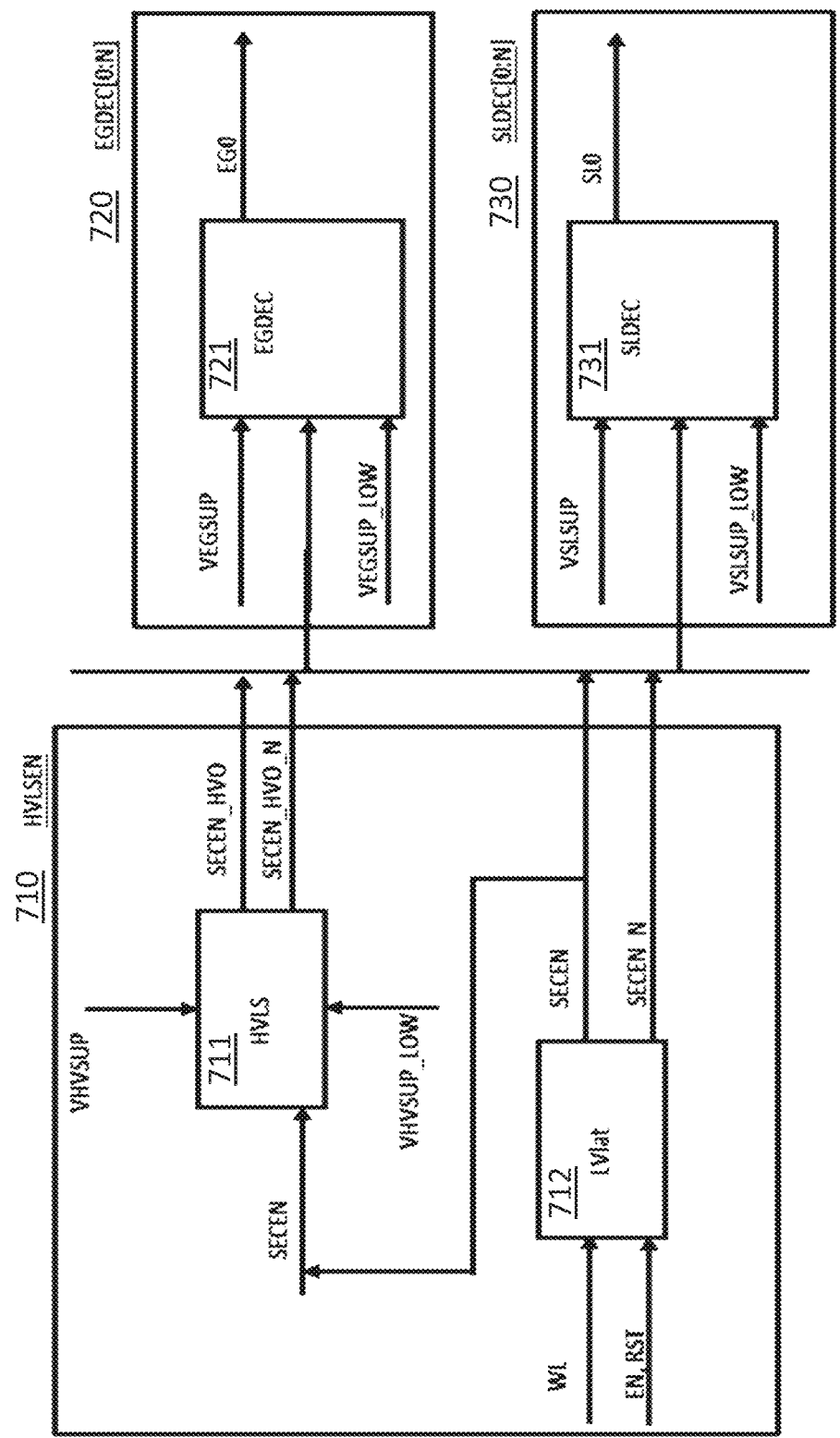
FIG. 7 is a block diagram of decoder circuitry for use with the memory device of FIG. 5.

FIG. 7 depicts high voltage row decoder 700. It will be recalled that in the embodiments of this invention, high voltage signals (e.g., 7-9V for the source line during a programming operation) are required to compensate for the lack of a coupling gate in the flash memory cells. High voltage decoder 700 comprises high voltage level shift enable circuit 710, erase gate decoder 720, and source line decoder 730.

High voltage level shift enable circuit 710 comprises high voltage level shift circuit 711 and low voltage latch 712. Low voltage latch 712 receives word line (WL), enable (EN), and reset (RST) as input signals and outputs sector enable signal (SECEN) and sector enable signal bar (SECEN_N). Sector enable signal (SECEN) is provided as an input to high voltage level shift circuit 711, which outputs sector enable signal high voltage (SECEN_HV0 . . . SECEN_HVN for N sectors) and sector enable signal high voltage bar (SECEN_HV0_N . . . SECEN_HVN _N for N sectors).

Erase gate decoder 720 comprises erase gate decoder 721 for row 0 in the sector, and similar erase gate decoders (not shown) for rows 1, . . . , N in the sector. Here, erase gate decoder 721 receives the sector enable signal high voltage (SECEN_HV0) from high voltage level shift circuit 711, its complement (SECEN_HV0_N), a voltage erase gate supply (VEGSUP), a low voltage erase gate supply (VEGSUP_LOW), sector enable signal (SECEN), and its complement (SECEN_N). Thus, the output EG0 of erase gate decoder 721 can be at one of three different voltage levels: SECEN_HV0 (high voltage), VEGSUP (normal voltage), or VEGSUP_LOW (low voltage).

Similarly, source line decoder 730 comprises source line decoder 721 for row 0 in the sector, and similar source line decoders (not shown) for rows 1, . . . , N in the sector. Here, source line decoder 731 receives sector enable signal high voltage (SECEN_HV0) from high voltage level shift circuit 711, its complement (SECEN_HV0_N), a voltage source line supply (VSLSUP), a low voltage source line supply (VSLSUP LOW), sector enable signal (SECEN), and its complement (SECEN_N). Thus, the output SL0 of source line decoder 730 can be at one of three different voltage levels: SECEN_HV0 (high voltage), VSLSUP (normal voltage), or VSLSUP_LOW (low voltage).

Figure 8:
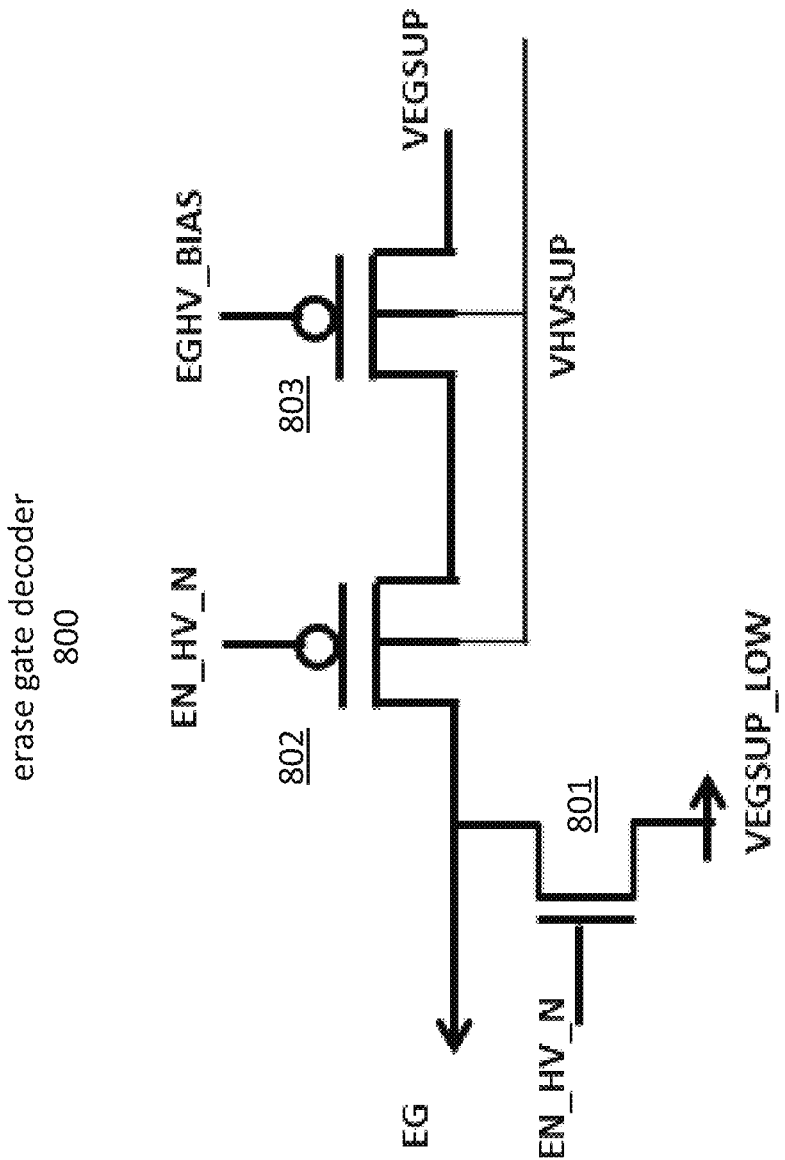
FIG. 8 depicts an embodiment of an erase gate decoder for use with the memory device of FIG. 5.

FIG. 8 shows erase gate decoder 800, which is an embodiment of erase gate decoder 720. Erase gate decoder 800 comprises NMOS transistor 801 and PMOS transistors 802 and 803, configured as shown. PMOS transistor 803 is a current limiter with EGHV_BIAS as a current mirror bias level. When this erase gate signal (EG) is to be asserted, EN_HV_N will be low (e.g., 0V or 1.2V or 2.5V), which will turn on PMOS transistor 802 and turn off NMOS transistor 801, which will cause erase gate (EG) to be high (i.e. =VEGSUP, for example 11.5V). When this erase gate signal (EG) is to be not asserted, EN_HV_N will be high, which will turn off PMOS transistor 802 and turn on NMOS transistor 801, which will cause erase gate (EG) to be low (i.e., =VEGSUP_LOW level, for example 0v or 1.2V or 2.5V).

Figure 9:
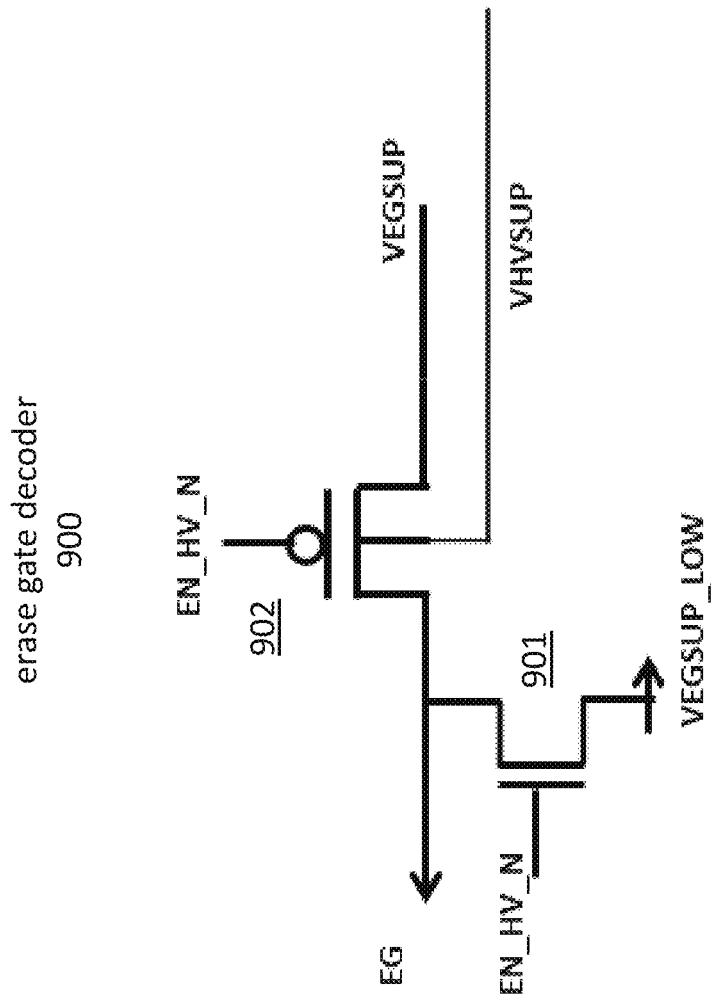
FIG. 9 depicts an embodiment of an erase gate decoder for use with the memory device of FIG. 5.

FIG. 9 shows erase gate decoder 900, which another embodiment of erase gate decoder 720. Erase gate decoder 900 comprises NMOS transistor 901 and PMOS transistor 902. Erase gate decoder 900 in this example does not contain a current limiter. When this erase gate signal (EG) is to be asserted, EN_HV_N will be low (e.g., 0V or 1.2V), which will turn on PMOS transistor 902 and turn off NMOS transistor 901, which will cause erase gate (EG) to be high. When this erase gate signal (EG) is to be not asserted, EN_HV_N will be high, which will turn off PMOS transistor 902 and turn on NMOS transistor 901, which will cause erase gate (EG) to be low (e.g., 0V or 1.2V or 2.5V).

Figure 10:
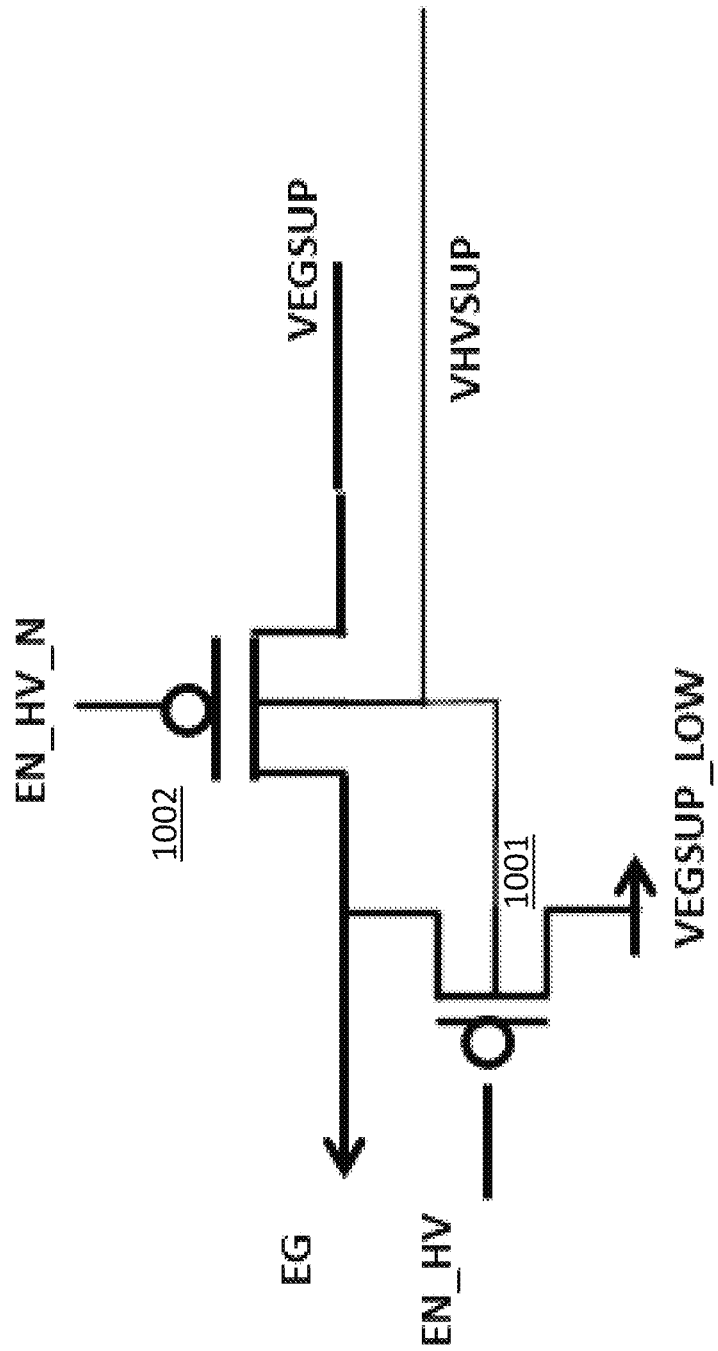
FIG. 10 depicts an embodiment of an erase gate decoder for use with the memory device of FIG. 5.

FIG. 10 shows erase gate decoder 1000, which is another embodiment of erase gate decoder 720 that uses only PMOS transistors. Erase gate decoder 1000 comprises PMOS transistors 1001 and 1002, which share a common well. Erase gate decoder 1000 in this example does not contain a current limiter. When this erase gate signal (EG) is to be asserted, EN_HV_N will be low and EN_HV will be high, which will turn on PMOS transistor 1002 and turn off PMOS transistor 1001, which will cause erase gate (EG) to be high. When this erase gate signal (EG) is to be not asserted, EN_HV_N will be low and EN_HV will be high, which will turn off PMOS transistor 1002 and turn on PMOS transistor 1001, which will cause erase gate (EG) to be low (e.g., 0V or 1.2V or 2.5V).

Figure 11:
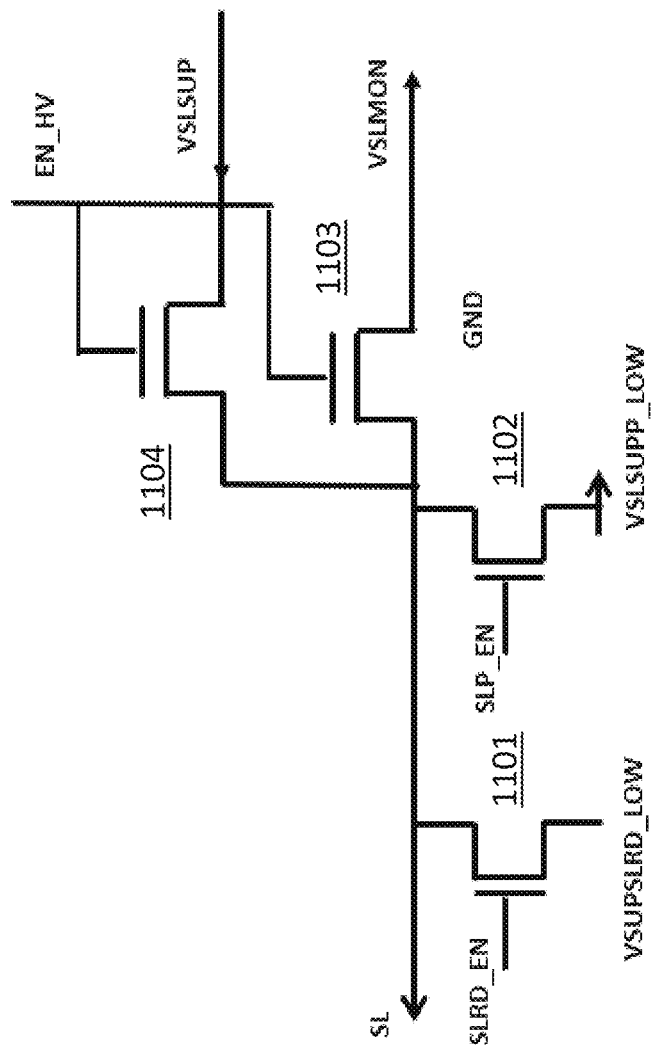
FIG. 11 depicts an embodiment of a source line decoder for use with the memory device of FIG. 5.

FIG. 11 shows source line decoder 1100, which is an embodiment of source line decoder 730. Source line decoder 1100 comprises NMOS transistors 1101, 1102, 1103, and 1104, configured as shown. NMOS transistor 1101 pulls the source line (SL) low during a read operation in response to the SLRD_EN signal. NMOS transistor 1102 pulls the source line (SL) low during a programming operation in response to the SLP_EN signal. NMOS transistor 1103 performs a monitoring function, through output VSLMON. NMOS transistor 1104 provides a voltage to source line (SL) in response to the EN_HV signal.

Figure 12:
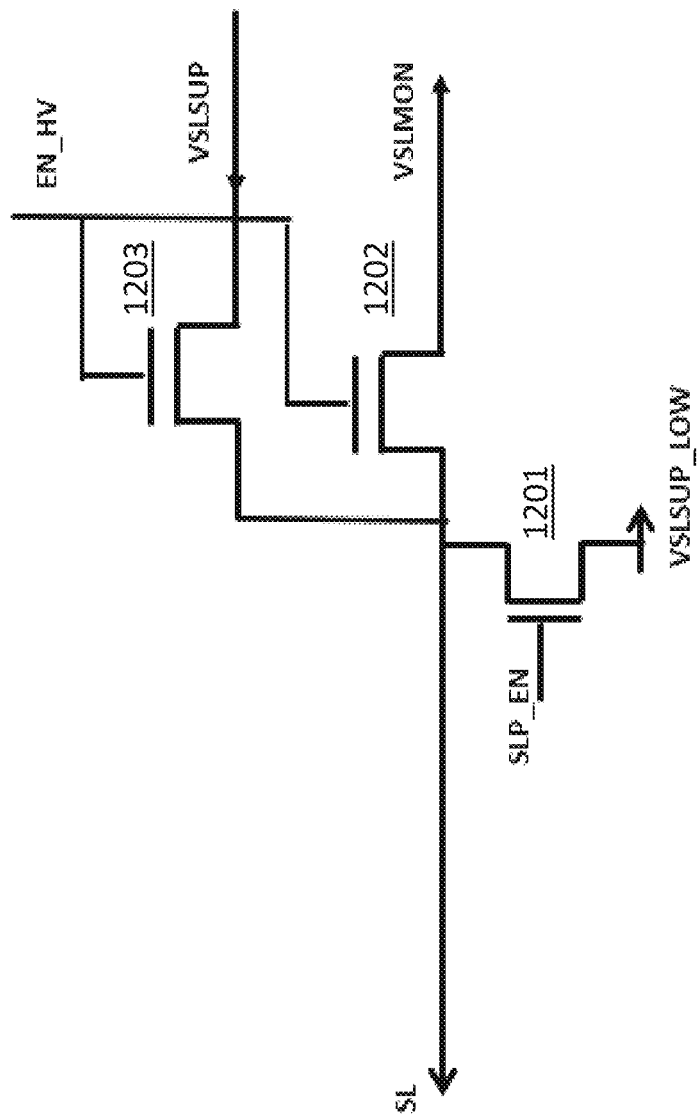
FIG. 12 depicts an embodiment of a source line decoder for use with the memory device of FIG. 5.

FIG. 12 shows source line decoder 1200, which is another embodiment of source line decoder 730. Source line decoder 1200 comprises NMOS transistors 1201, 1202, and 1203, configured as shown. NMOS transistor 1201 pulls the source line (SL) low during a programming operation in response to the SLP_EN signal. NMOS transistor 1202 performs a monitoring function, through output VSLMON. NMOS transistor 1203 provides a voltage to source line (SL) in response to the EN_HV signal.

Figure 13:
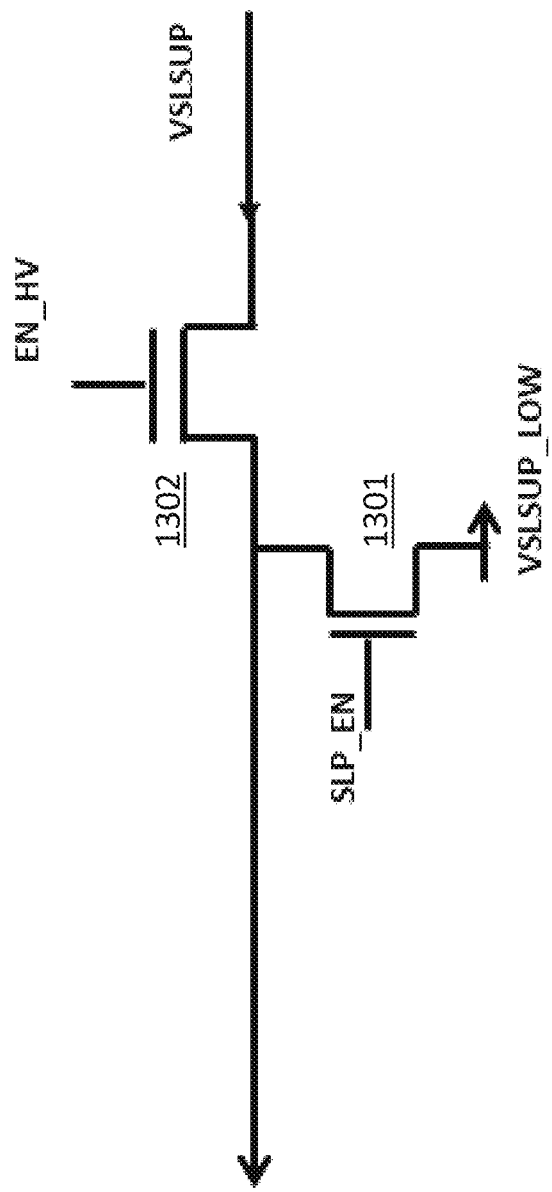
FIG. 13 depicts an embodiment of a source line decoder for use with the memory device of FIG. 5.

FIG. 13 shows source line decoder 1300, which is another embodiment of source line decoder 730. Source line decoder 730 comprises NMOS transistors 1301 and 1302, configured as shown. NMOS transistor 1301 pulls the source line (SL) low during a programming operation in response to the SLP_EN signal. NMOS transistor 1302 provides a voltage to source line (SL) in response to the EN_HV signal.

Figure 14:
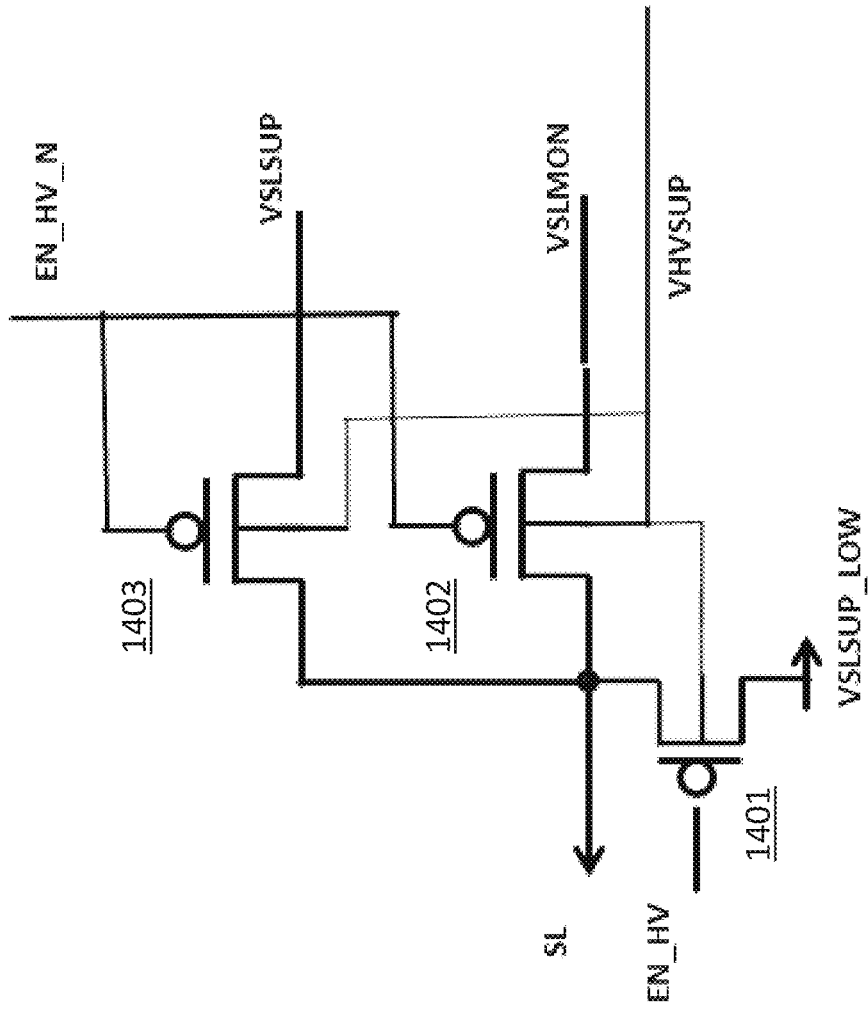
FIG. 14 depicts an embodiment of a source line decoder for use with the memory device of FIG. 5.

FIG. 14 shows source line decoder 1400, which is another embodiment of source line decoder 730 that uses only PMOS transistors. Source line decoder 1400 comprises PMOS transistors 1401, 1402, and 1403, configured as shown. PMOS transistor 1401 pulls the source line (SL) low during a programming operation in response to the EN_HV signal. PMOS transistor 1402 performs a monitoring function, through output VSLMON. PMOS transistor 1403 provides a voltage to source line (SL) in response to the EN_HV_N signal.

Figure 15:
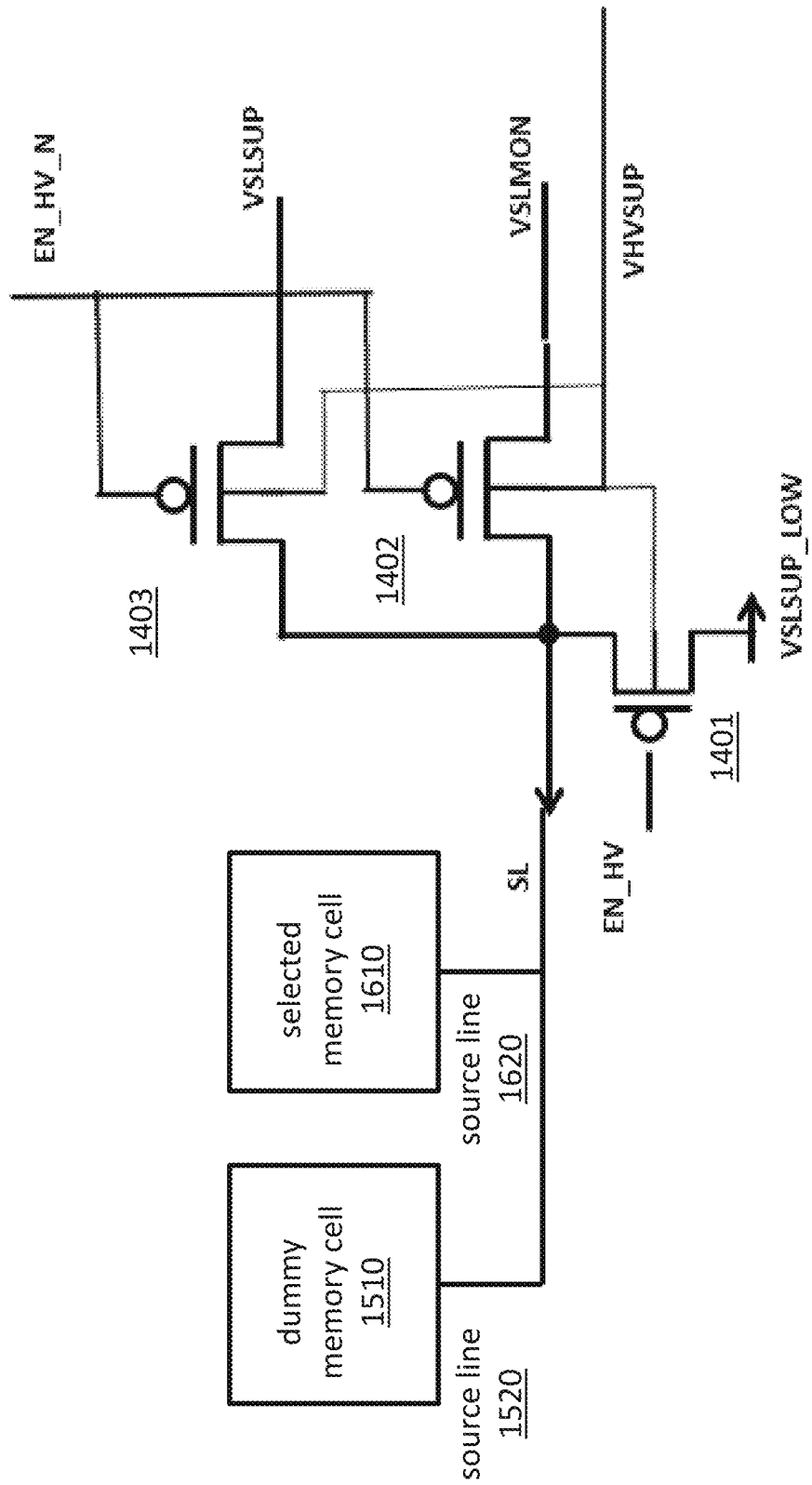
FIG. 15 depicts an embodiment of a source line decoder with a dummy flash memory cell for selectively pulling down to a low voltage or ground a source line.

FIG. 15 depicts source line decoder 1500, which is another embodiment of source line decoder 730 that is a variation of source line decoder 1400 in FIG. 14. Source line decoder comprises source line decoder 1400. The source line (SL) of source line decoder 1400 is connected to the source line 1620 of selected memory cell 1620 and source line 1520 of a dummy memory cell 1510 during read operations. Dummy memory cell 1510 follows the same construction as selected memory cell 1610, which can be based on the design of memory cell 300, except that dummy memory cell 1510 is not used to store data.

Figure 16:
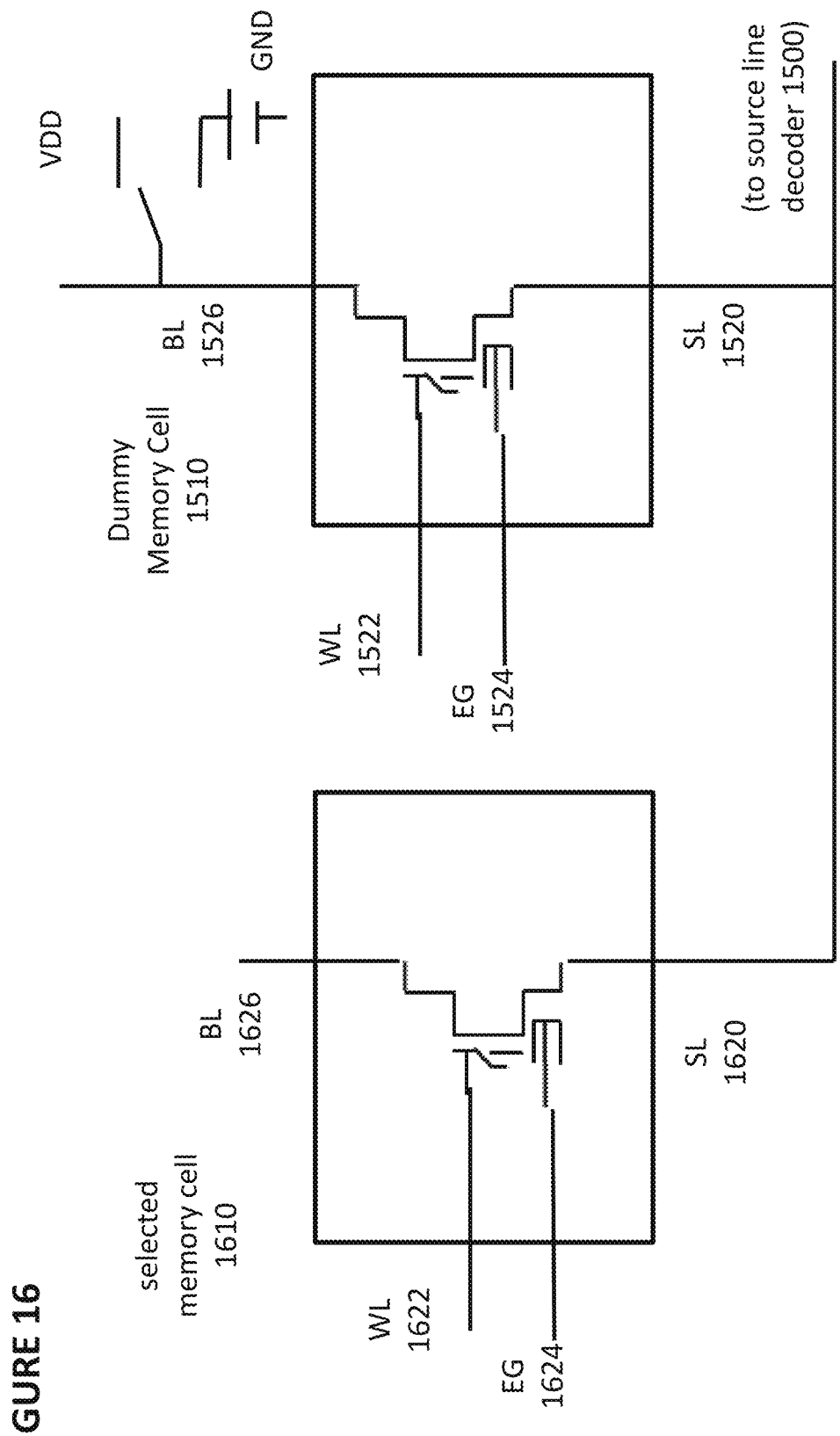
FIG. 16 depicts an embodiment of a dummy flash memory cell for selectively pulling down to a low voltage or ground a source line coupled to a selected flash memory cell.

FIG. 16 shows additional detail regarding selected memory cell 1620 and dummy memory cell 1520. When selected memory cell 1620 is in read mode or erase mode, source line 1620 and source line 1520 are coupled to ground through dummy memory cell 1510 and dummy bitline 1526 which is coupled to ground. Dummy memory cell 1510 is required to be erased before read operation. This will pull source line 1520 and source line 1620 to ground.

When selected memory cell 1610 is in program mode, bitline 1526 is coupled to an inhibit voltage such as VDD. This will place dummy memory cell 1510 in a program inhibit mode which will maintain dummy memory cell 1520 in am erased state. A plurality of the dummy cells, such as dummy memory cell 1510, can be connected to memory cell 1610 through their source lines to strengthen the pull down of the source line 1620 to ground.

Figure 2:
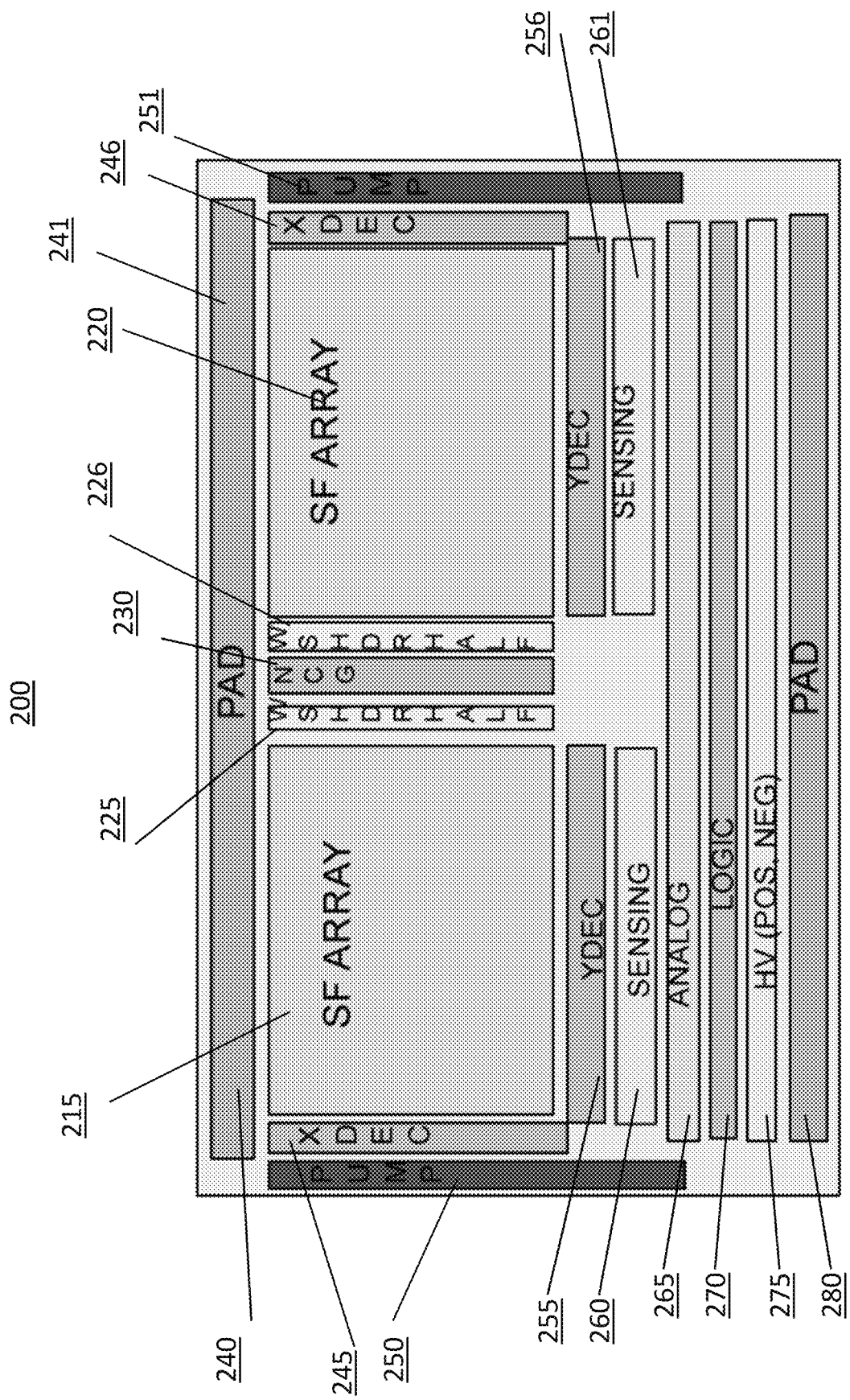
FIG. 2 is a block diagram of a non-volatile memory device using the non-volatile memory cell of the prior art shown in FIG. 1.
Figure 17:
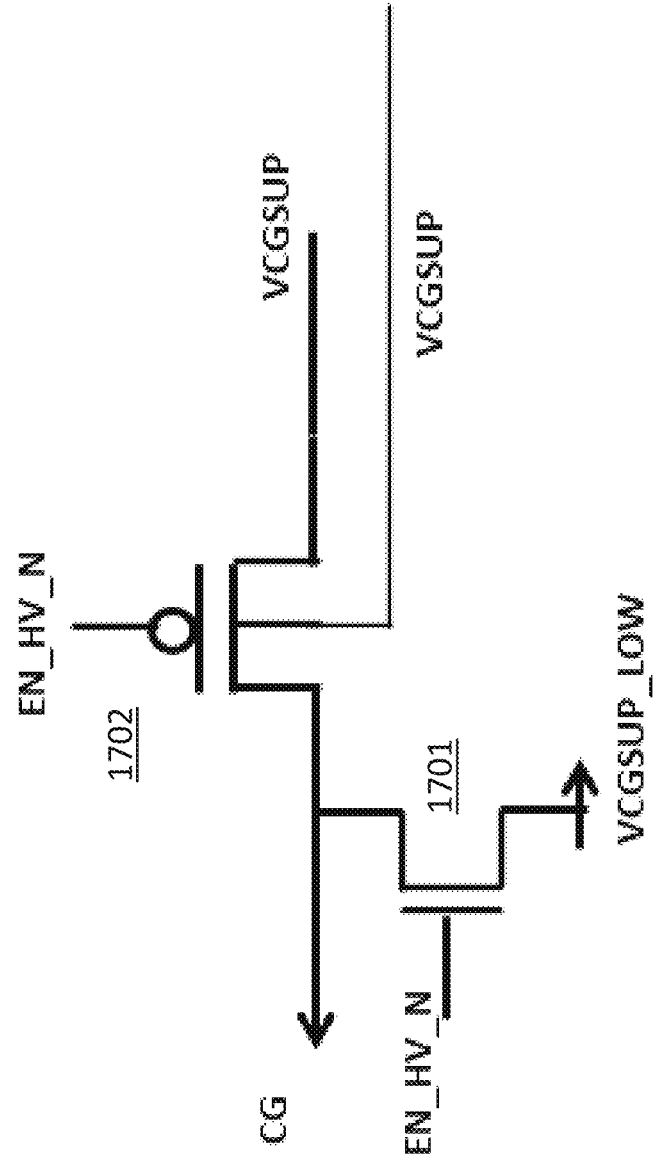
FIG. 17 depicts an embodiment of a control gate decoder for use with a memory device using the memory cell of FIG. 1.

FIG. 17 depicts control gate decoder 1700, which is a control gate decoder that can be used with the prior art design of FIGS. 1-2, and which is not needed in the embodiments of FIGS. 3-16. Control gate decoder 1700 comprises NMOS transistor 1701 and PMOS transistor 1702. NMOS transistor 1701 will pull down the control gate signal (CG) in response to the signal EN_HV_N. PMOS transistor 1702 will pull up the control gate signal (CG) in response to the signal EN_HV_N.

Figure 18:
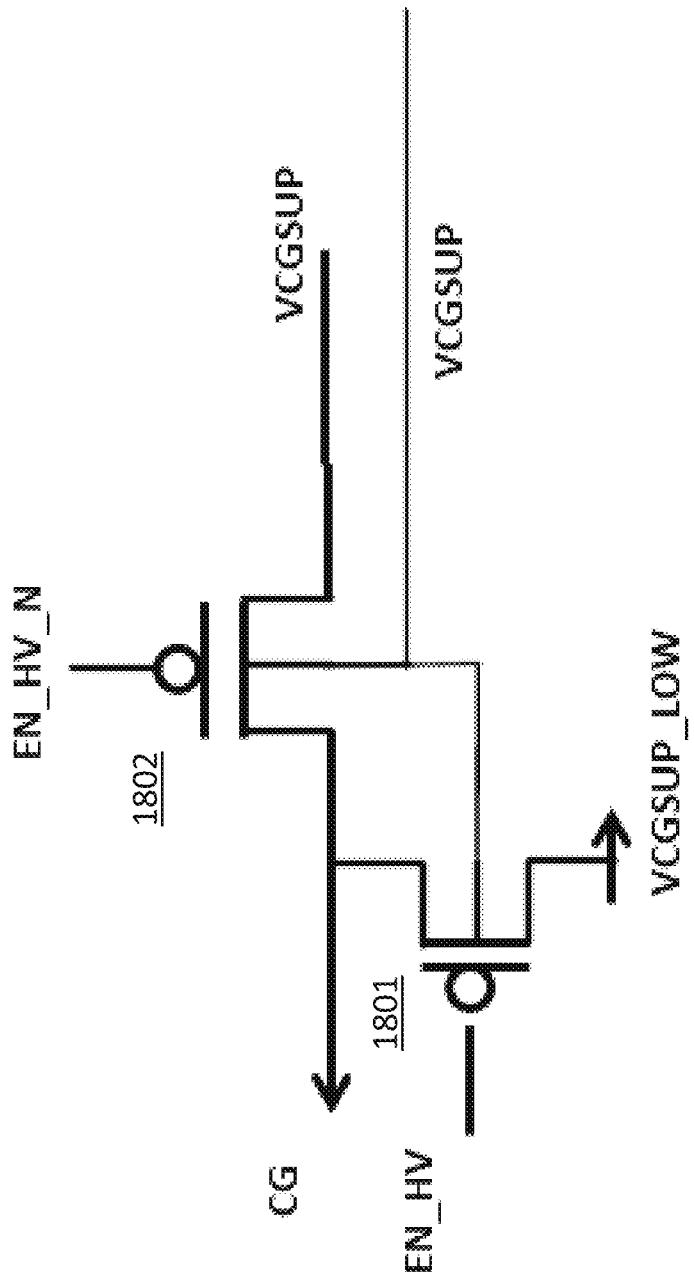
FIG. 18 depicts an embodiment of a control gate decoder for use with a memory device using the memory cell of FIG. 1.

FIG. 18 depicts control gate decoder 1800 that uses only PMOS transistors, which is another embodiment of a control gate decoder that can be used with the prior art design of FIGS. 1-2, and which is not needed in the embodiments of FIGS. 3-16. Control gate decoder 1800 comprises PMOS transistors 1801 and 1802. PMOS transistor 1801 will pull down the control gate signal (CG) in response to the signal EN_HV. PMOS transistor 1802 will pull up the control gate signal (CG) in response to the signal EN_HV_N.

Figure 19:
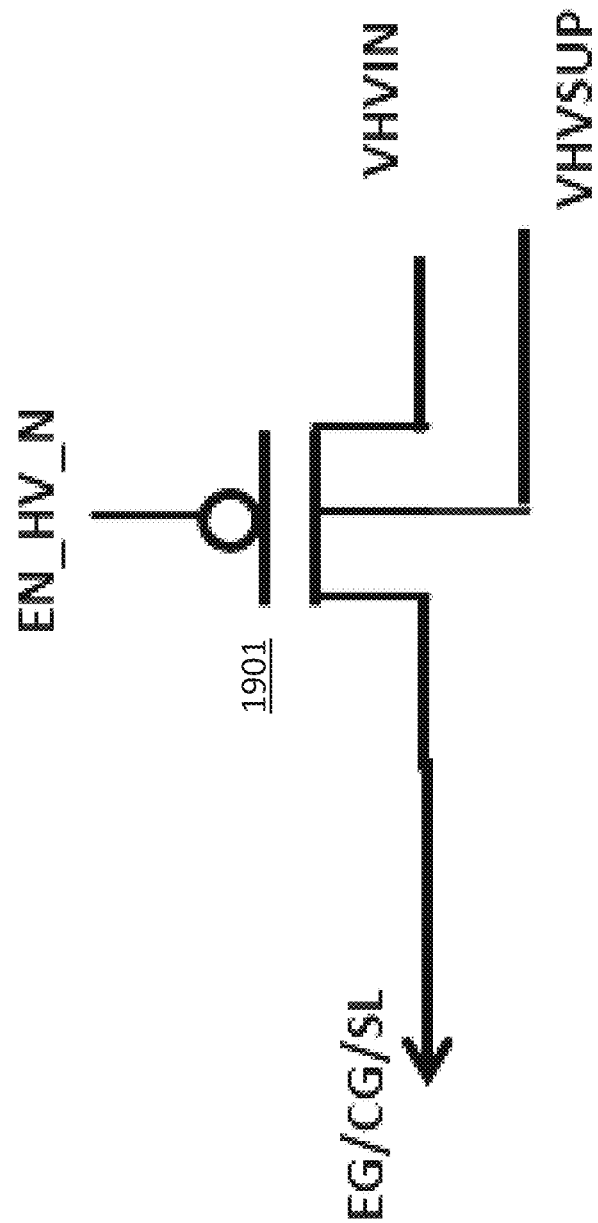
FIG. 19 depicts an embodiment of a gate decoder for use with a memory device using the memory cell of FIG. 1.

FIG. 19 depicts EG/CG/SL gate decoder 1900, that can be used with the prior art design of FIGS. 1-2, and in the embodiments of FIGS. 3-16, thus showing the amount of space saved through the present invention. Gate decoder 1900 comprises PMOS transistors 1901. PMOS transistor 1901 will pull low the gate signal (EG/CG/SL) high in response to the signal EN_HV_N. If EN_HV_N is not asserted, then the value of EG/CG/SL will float. The EG/CG/SL gate is pre-charged to a low bias level first before being enabled to a high voltage level.

Figure 20:
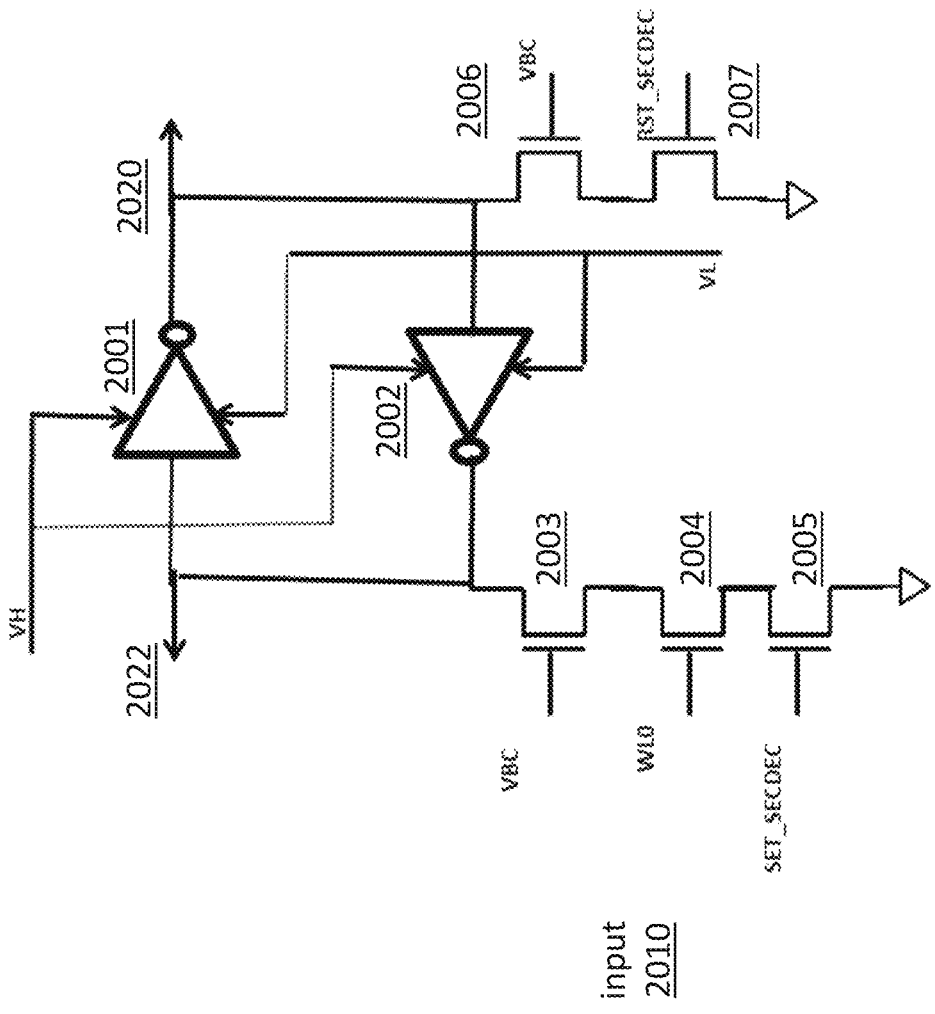
FIG. 20 depicts an embodiment of a latch voltage level shifter for use with the memory device of FIG. 5.

FIG. 20 depicts latch voltage level shifter 2000 with adaptive high voltage VH and low VL supplies. Latch voltage level shifter comprises a latch comprising inverters 2001 and 2002 and NMOS transistors 2003, 2004, 2005, 2006, and 2007, in the configuration shown. Latch voltage level shifter receives input 2012 to reset (input RST_SECDEC) and input 2010 to set, meaning enabling, (inputs WL0 and SET_SECDEC) and produces output 2020 and 2022. Latch voltage level shifter will adaptively change the magnitudes of a "high" voltage or a "low" voltage to minimize the voltage stress. The latch inverters 2001 and 2002 received power supply high VH and power supply low VL. Initially when enabling by the inputs 2010/2012, VH is Vdd, e.g. 1.2V, and VL is gnd. Then VH starts to ramp up to an intermediate VH level, e.g. 5V. At this VH level, VL then ramps to an intermediate VL level, e.g., 2.5V. After VL reached the intermediate VL level, VH then ramps to final high voltage supply VHVSUP level, e.g., 11.5V. At this point, the voltage across the inverters is only 11.5V−2.5V=9V, hence reducing the voltage stress across them.

Figure 21:
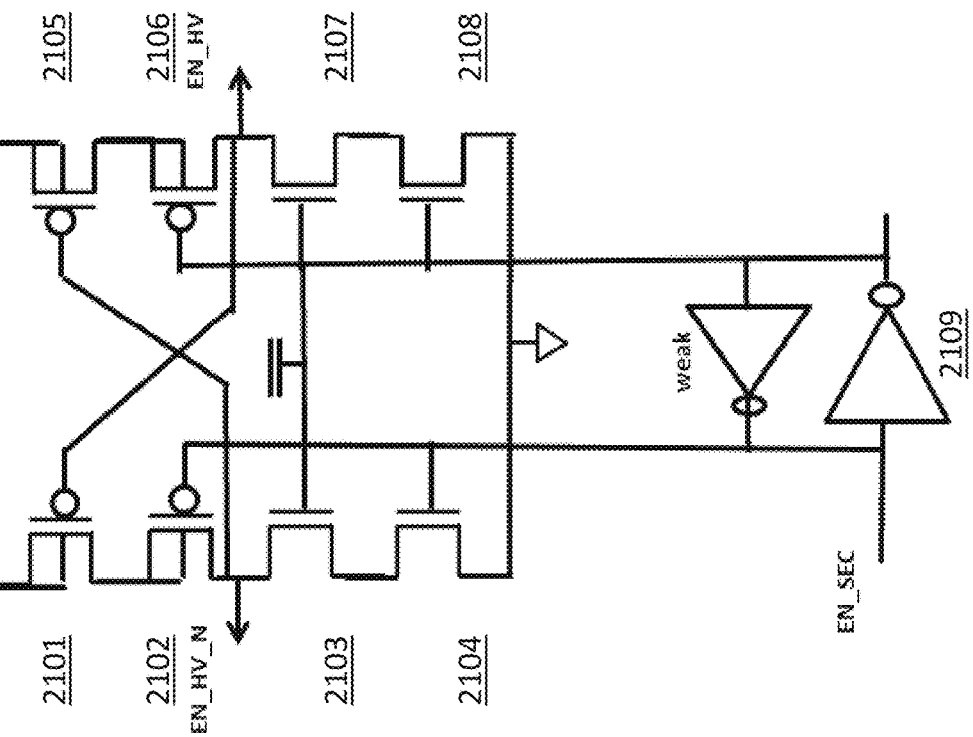
FIG. 21 depicts an embodiment of a latch voltage level shifter for use with the memory device of FIG. 5.

FIG. 21 depicts latch voltage shifter 2100. Latch voltage shifter 2100 comprises low voltage latch inverter 2109, NMOS transistors 2103, 2104, 2107, and 2108, and PMOS transistors 2101, 2102, 2105, and 2106, in the configuration shown. Latch voltage shifter 2100 receives EN_SEC as an input and outputs EN_HV and EN_HV_N, which have a larger voltage swing than EN_SEC and ground.

Figure 22:
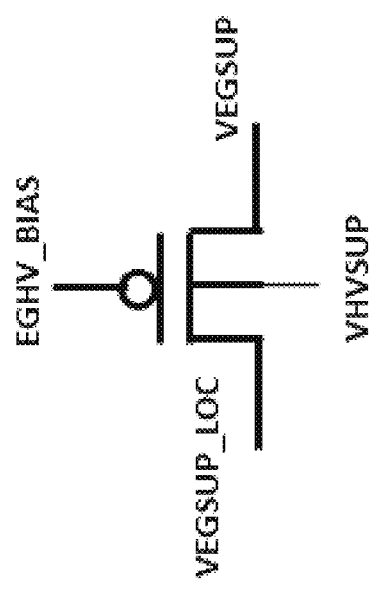
FIG. 22 depicts an embodiment of a high voltage current limiter for use with the memory device of FIG. 5.

FIG. 22 depicts high voltage current limiter 2200, which comprises a PMOS transistor that receives VEGSUP_LOC and outputs VEGSUP with a limited current (acting as a current bias). This circuit can be used with the circuits that do not have local current limiter such as in FIGS. 9, 10, 17, 18, 19 to limit current.

Figure 23:
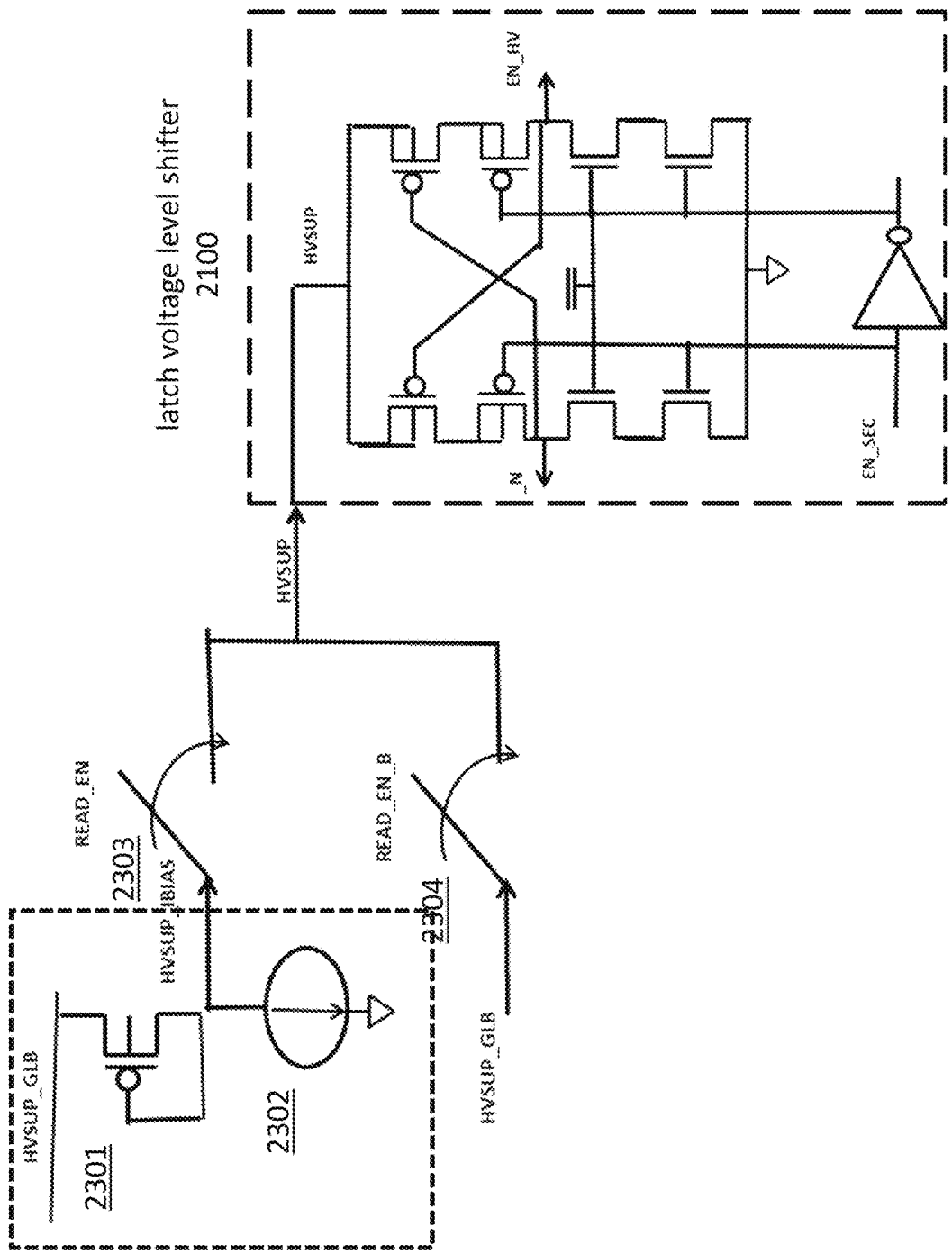
FIG. 23 depicts an embodiment of a latch voltage level shifter for use with the memory device of FIG. 5.

FIG. 23 depicts latch voltage shifter 2300 with a current limiter for read operations. Latch voltage shifter 2300 comprises latch voltage shifter 2100 from FIG. 21. It also comprises current limiter 2310 comprising PMOS transistor 2301 and current source 2302. Current limiter 2310 is connected to current limiter 2310 through switch 2303. Latch voltage shifter 2100 also is connected to the signal HVSUP_GLB through switch 2304. During a read operation, latch voltage level shifter 2100 will be connected to current limiter 2310 through switch 2303. The outputs (e.g., approximately one Vt threshold voltage below Vdd2.5V) of the latch voltage level shifter 2100 control the gate of the EG and CG decoders as in FIGS. 8, 9, 10, 17, 18, 19. When not in a read operation, latch voltage level shifter 2100 will be connected to HVSUP_GLB through switch 2304.

Figure 24:
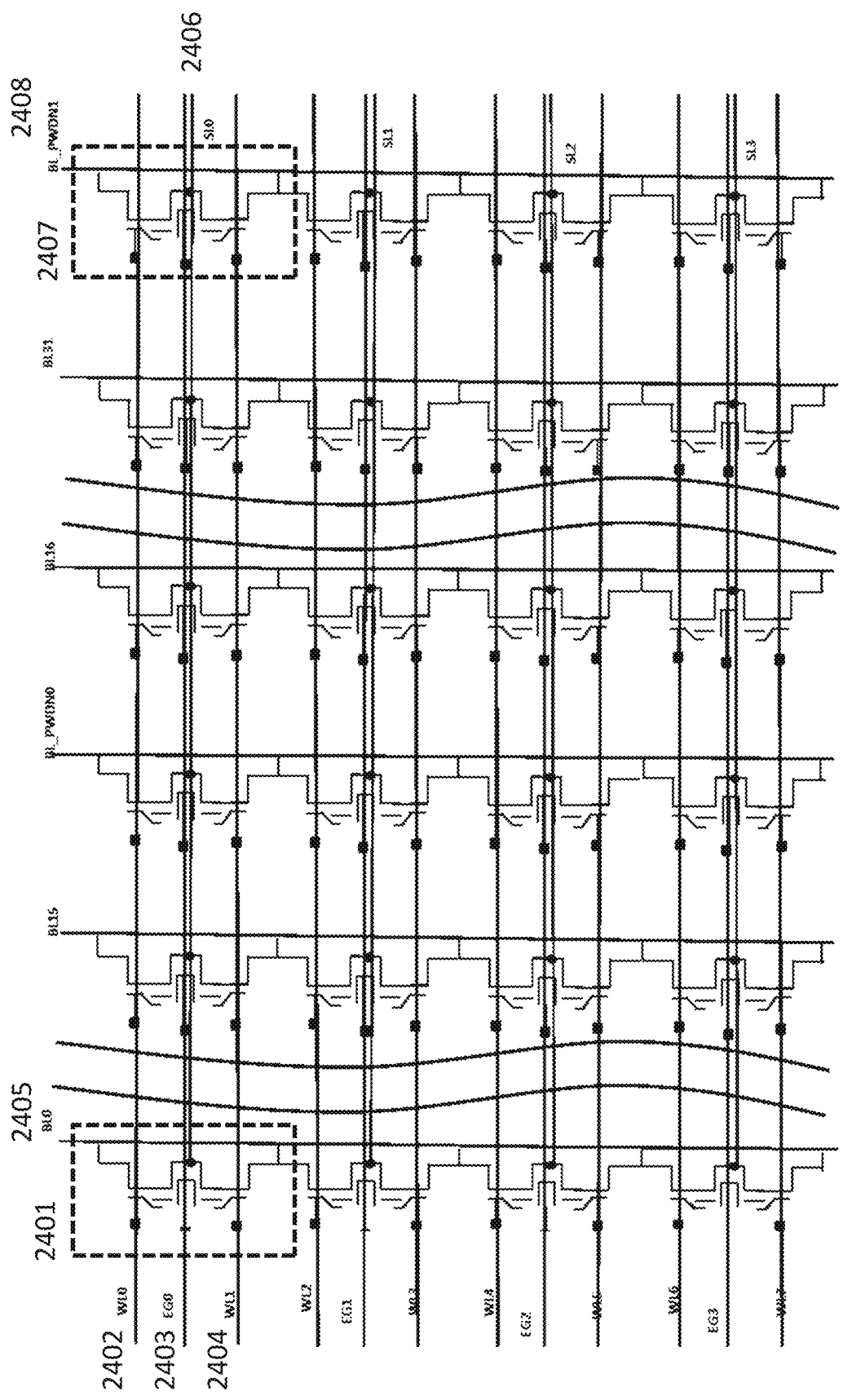
FIG. 24 depicts an embodiment of an array of flash memory cells with a column of dummy memory cells for selectively pulling down to a low voltage or ground a selected source line.

FIG. 24 depicts an array with source line pulldown 2400, which utilizes the designs of FIGS. 15 and 16. Array with source line pulldown 2400 comprises a plurality of memory cells organized into rows (indicated by word lines WL0, WL7) and columns (indicated by bit lines BL0, . . . , BL31). An exemplary memory cell pair is memory cell pair 2401, which comprises one cell coupled to word line 2402 (WL0) and another cell coupled to word line 2404 (WL1). The two cells share erase gate 2403 (EG0) and source line 2406 (SL0). A column of dummy memory cells also is present, here shown attached to bit line BL_PWDN1. An exemplary dummy memory cell pair is dummy memory cell pair 2407, which comprises one cell coupled to word line 2402 (WL0) and another cell coupled to word line 2404 (WL1). The two cells share erase gate 2403 (EG0) and source line 2406 (SL0). The selected memory cells and dummy memory cells can be configured during read operations as discussed previously for FIGS. 15 and 16.

What is claimed is:

1. A non-volatile memory device comprising:
   an array of flash memory cells organized in rows and columns, each flash memory cell comprising a bit line terminal, a word line terminal, an erase gate terminal, and a source line terminal;
   a high voltage circuit for generating a high voltage; and
   a high voltage row decoder comprising an erase gate decoder and a source line decoder, wherein the high voltage row decoder selects one or more rows in response to select signals and wherein the erase gate decoder applies the high voltage to erase gate terminals of the one or more rows or the source line decoder applies the high voltage to source line terminals of the one or more rows;
   wherein the erase gate decoder comprises transistors only of a PMOS type and the source line decoder comprises transistors only of a PMOS type.

2. The non-volatile memory device of claim 1, wherein the erase gate decoder applies the high voltage to erase gate terminals of the one or more rows during an erase operation.

3. The non-volatile memory device of claim 1, wherein the source line decoder applies the high voltage to source line terminals of the one or more rows during a program operation.

4. The non-volatile memory device of claim 1, wherein the high voltage circuit comprises a high voltage level shifter.

5. The non-volatile memory device of claim 4, wherein the high voltage circuit further comprises a current limiter.

6. The non-volatile memory device of claim 1, wherein the high voltage circuit further comprises a current limiter.

7. A method of operating a non-volatile memory device comprising an array of flash memory cells organized in rows and columns, each flash memory cell comprising a bit line terminal, a word line terminal, an erase gate terminal, and a source line terminal, the method comprising:
   generating a high voltage;
   selecting one or more rows in response to select signals; and
   performing one of:
      applying, by an erase gate decoder, the high voltage to erase gate terminals of the one or more rows; and
      applying, by a source line decoder, the high voltage to source line terminals of the one or more rows;
   wherein the erase gate decoder comprises transistors only of a PMOS type and the source line decoder comprises transistors only of a PMOS type.

8. The method of claim 7, wherein the step of applying, by an erase gate decoder, the high voltage to erase gate terminals of the one or more rows occurs during an erase operation.

9. The method of claim 7, wherein the step of applying, by a source line decoder, the high voltage to source line terminals of the one or more rows occurs during a program operation.

10. The method of claim 7, wherein the generating step is performed by a high voltage circuit.

11. The method of claim 10, wherein the high voltage circuit comprises a high voltage level shifter.

12. The method of claim 11, wherein the high voltage circuit further comprises a current limiter.

13. The method of claim 10, wherein the high voltage circuit further comprises a current limiter.

* * * * *